United States Patent
Liu et al.

(10) Patent No.: US 11,726,405 B2
(45) Date of Patent: Aug. 15, 2023

(54) PHOTORESIST FOR SEMICONDUCTOR FABRICATION

(71) Applicant: Taiwan Semiconductor Manufacturing Company, Ltd., Hsinchu (TW)

(72) Inventors: Chih-Cheng Liu, Hsinchu (TW); Yi-Chen Kuo, Hsinchu (TW); Yen-Yu Chen, Hsinchu (TW); Jr-Hung Li, Hsinchu County (TW); Chi-Ming Yang, Hsinchu (TW); Tze-Liang Lee, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 256 days.

(21) Appl. No.: 17/177,008

(22) Filed: Feb. 16, 2021

(65) Prior Publication Data
US 2022/0100086 A1    Mar. 31, 2022

Related U.S. Application Data

(60) Provisional application No. 63/085,305, filed on Sep. 30, 2020.

(51) Int. Cl.
| | |
|---|---|
| *G03F 7/004* | (2006.01) |
| *C07F 7/22* | (2006.01) |
| *C07F 5/00* | (2006.01) |
| *C07F 9/90* | (2006.01) |
| *C07F 9/94* | (2006.01) |
| *G03F 7/20* | (2006.01) |

(52) U.S. Cl.
CPC ........... *G03F 7/0042* (2013.01); *C07F 5/003* (2013.01); *C07F 7/2284* (2013.01); *C07F 9/902* (2013.01); *C07F 9/94* (2013.01); *G03F 7/2004* (2013.01)

(58) Field of Classification Search
CPC ........ G03F 7/0042; C07F 7/22; C07F 7/2284; C07F 9/90; C07F 9/902; C07F 9/94
See application file for complete search history.

(56) References Cited

U.S. PATENT DOCUMENTS

| | | | | |
|---|---|---|---|---|
| 4,511,715 | A * | 4/1985 | Palensky | C08G 77/38 548/102 |
| 10,741,410 | B2 | 8/2020 | Zi et al. | |
| 2012/0208125 | A1* | 8/2012 | Hatakeyama | G03F 7/0043 430/296 |
| 2013/0224652 | A1* | 8/2013 | Bass | G03F 7/0042 430/296 |

(Continued)

OTHER PUBLICATIONS

Robert Kirgan et al., Synthesis, Characterization, Photophysical, and Computational Studies of Rhenium(I) Tricarbonyl Complexes Containing the Derivatives of Bipyrazine, Inorg. Chem. 2007, vol. 46, 6464-6472, American Chemical Society published on Web Jul. 14, 2007.

*Primary Examiner* — John S Chu
(74) *Attorney, Agent, or Firm* — Haynes and Boone, LLP

(57) ABSTRACT

An organometallic precursor for extreme ultraviolet (EUV) lithography is provided. An organometallic precursor includes an aromatic di-dentate ligand, a transition metal coordinated to the aromatic di-dentate ligand, and an extreme ultraviolet (EUV) cleavable ligand coordinated to the transition metal. The aromatic di-dentate ligand includes a plurality of pyrazine molecules.

20 Claims, 11 Drawing Sheets

(56) References Cited

U.S. PATENT DOCUMENTS

| | | | |
|---|---|---|---|
| 2015/0099228 A1* | 4/2015 | Hatakeyama | G03F 7/0043 430/326 |
| 2020/0073238 A1 | 3/2020 | Zi et al. | |
| 2020/0110338 A1 | 4/2020 | Zi et al. | |
| 2020/0272051 A1 | 8/2020 | Ho et al. | |

* cited by examiner

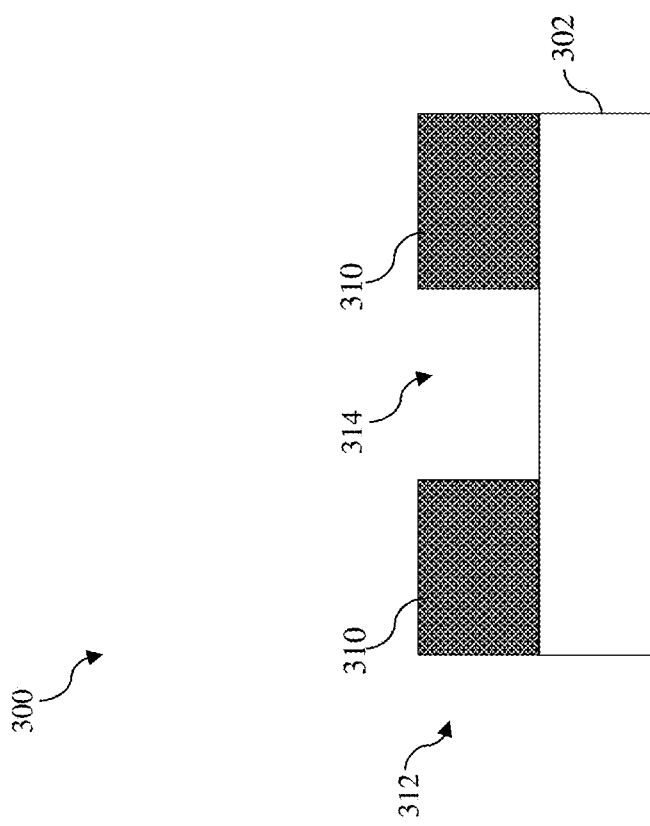

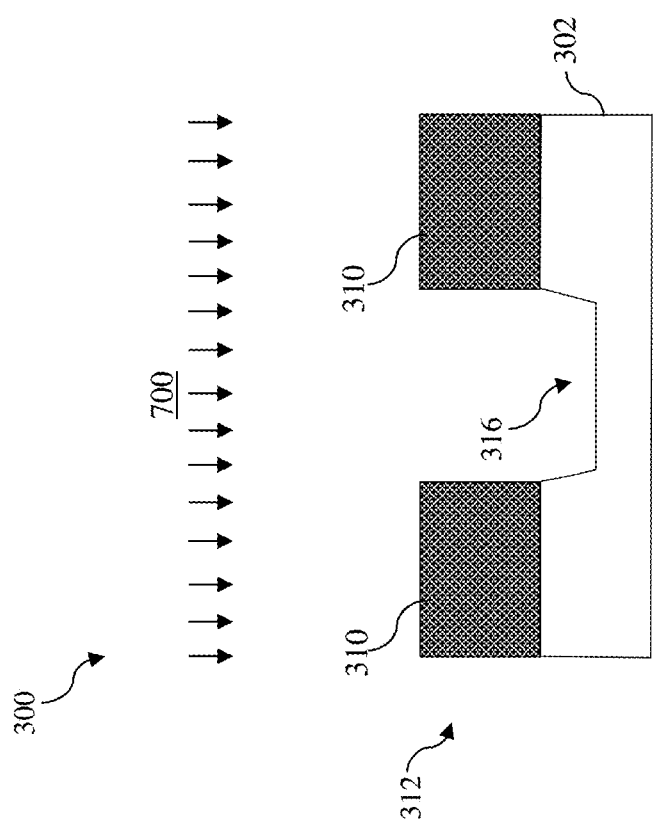

PHOTORESIST FOR SEMICONDUCTOR FABRICATION

PRIORITY DATA

This application claims priority to U.S. Provisional Patent Application Ser. No. 63/085,305, filed on Sep. 30, 2020, the entire disclosure of which is hereby incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

In one exemplary aspect, photolithography is a process used in semiconductor micro-fabrication to selectively remove parts of a material layer. The process uses a radiation source to transfer a pattern (e.g., a geometric pattern) from a photomask to a photo-sensitive layer (e.g., a photoresist layer) on the material layer. The radiation causes a chemical change (e.g., increasing or decreasing solubility) in exposed regions of the photo-sensitive layer. Bake processes may be performed before and/or after exposure, such as in a pre-exposure and/or a post-exposure bake process. A developing process then selectively removes the exposed or unexposed regions with a developer solution forming an exposure pattern in the material layer. To improve the resolution of the photolithography process to accommodate IC devices of high functional density, radiation sources with shorter wavelengths have emerged. One of them is an extreme ultraviolet (EUV) radiation source. Although existing EUV photoresists are generally adequate for their intended purposes, they have not been entirely satisfactory. Additional improvements are desirable.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 6-11 illustrate fragmentary cross-sectional views of a workpiece undergoing various steps of method 200 of FIG. 5, according to various aspects of the present disclosure.

DETAILED DESCRIPTION

Figure 1:
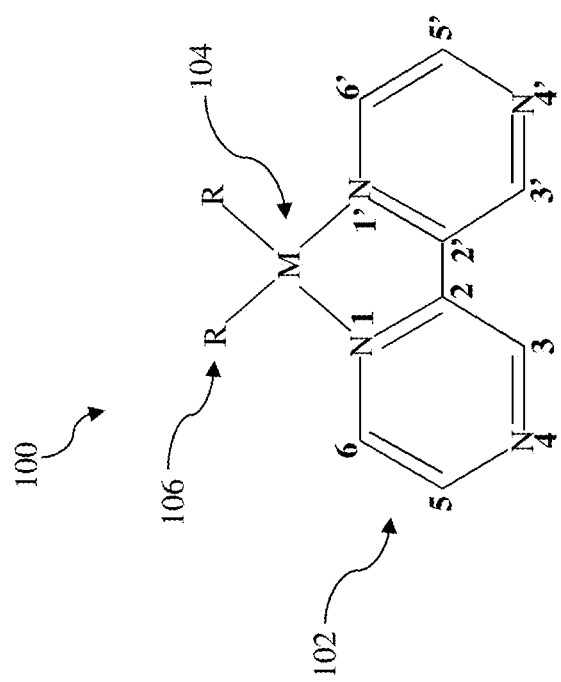
FIG. 1 schematically illustrates a molecular structure of an organometallic precursor, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

The present disclosure relates generally to EUV photolithography and, more particularly, to an organometallic precursor in EUV photoresists.

Some existing EUV photoresists come in the form of a solution that includes a cation species and an anion species. The anion species includes a metal ion coordinated with EUV-stable ligands and bridge ligands. The bridge ligands function as cross-linkers to coordinate to another metal ion. Example bridge ligands in some existing EUV may include an oxalate ion ($C_2O_4^{2-}$). Such EUV photoresists have poor adhesion to various surfaces. To improve adhesion, surface treatments or adhesion promoting layers are required ensure satisfactory adhesion. Examples of the adhesion promoting layers may include hexamethyldisilanzne (HMDS). In addition, because the bridge ligands are EUV-cleavable and cross-linkers at the same time, it is difficult to control the EUV-induced cross-linking process well. On the one hand, some bridge ligand need to be cleaved off from metal ions to create non-coordinated sites for crosslinking. On the other hand, some bridge ligands need to remain coordinated to the metal ions to serve as a cross-linker. When no bridges ligands are cleaved off or all bridge ligands are cleaved off, crosslinking may be unsatisfactory. Moreover, due to lack of structural match, a layer of an existing EUV photoresist may have a gradient of crosslinking along its depth. In some examples, the degree of crosslinking near the top surface is higher while the degree of crosslinking away from the top surface is lower. Such a gradient of crosslinking may result in scum defect, poor line edge roughness (LER), and low lithography contrast after development.

The present disclosure provides an organometallic precursor in a photoresist that includes an aromatic di-dentate ligand with a structural match for intermolecular coordination. In one embodiment of the present disclosure, the organometallic precursor includes a 2,2'-bipyrazine molecule coordinated to a transition metal that has high EUV absorption. The transition metal is also coordinated to EUV-cleavable ligands that may be cleaved off by EUV radiation to form non-coordinated sites. When the aromatic di-dentate ligand is an aromatic 2,2'-bipyrazine, two nitrogen atoms in the opposite side may coordinate to the non-coordinated sites. The structural match of the intermolecular coordination and the π-π interactions of the aromatic ligand may result in an ordered packing of layers. The ordered packing gives rise to a crystalline polymeric structure, leading to defect reduction (scum reduction), good LER, and high contrast.

The aromatic di-dentate ligand of the present disclosure meets several criteria. First, as the name suggests, the aromatic di-dentate ligand includes at least one aromatic ring to provide a conjugation system and allow π-π stacking. Second, the aromatic di-dentate ligand includes a denticity equal to 2. That is, the aromatic di-dentate ligand includes two atoms that can bind to a center metal ion in a coordination complex. It is not trivial for the aromatic di-dentate ligand to be di-dentate. Transition metal complexes may be characterized with coordination numbers that range from 1 to 12 but the most common coordination numbers are 2, 4, and 6. For a metal that has a high atomic absorption cross section, such as the ones described in the present disclosure, the coordination number is greater than 4 and is likely to be 6. If the metal must coordinate to two organometallic precursor molecules and still maintains unsaturated sites for adhesion improvement, each organometallic precursor can only be monodentate or bidentate. Because mono denticity is less conducive to ordered structure, bi-denticity is selected. Third, the aromatic di-dentate ligand includes a symmetric structure for ordered crosslinking. Fourth, in addition to the atoms that provide denticity, the aromatic di-dentate ligand includes EUV-activatable ligands for crosslinking. Fifth, the aromatic di-dentate ligand may optionally include a planar structure to facilitate π-π stacking, which is conducive to orderly interlayer interaction. Examples may include 2,2'-bipyrazine ($C_8H_6N_4$), 2,2'-bipyrimidine ($C_8H_6N_4$), 3,3'-bipyridazine ($C_8H_6N_4$), each of which includes two linked heterocyclic aromatic rings.

FIG. 1 illustrates a schematic molecular structure of an organometallic precursor molecule 100 according to aspects of the present disclosure. The organometallic precursor molecule 100 includes an aromatic di-dentate ligand (X) 102, an aromatic a metal ion (M) 104 coordinated to the aromatic di-dentate ligand 102, and a plurality of EUV-cleavable ligands (R) 106 coordinated to the metal ion 104. In the depicted embodiment, the aromatic di-dentate ligand 102 is an aromatic 2,2'-bipyrazine. It is understood that similar descriptions may apply to other aromatic di-dentate ligand 102 embodiments. The organometallic precursor molecule 100 may also be represented as $M_aX_bR_c$, where M denotes the metal ion 104, R denotes the EUV-cleavable ligand 106, X denotes the aromatic di-dentate ligand 102, "a" is 1, "b" is 1, and "c" is 2. The metal ion 104 may include a metal that has a high atomic absorption cross section. Examples of the metal ion 104 may include tin (Sn), bismuth (Bi), antimony (Sb), indium (In), or tellurium (Te). As the metal ion 104 may have six (6) coordination sites, the total number of the EUV-cleavable ligands (R) 106 and the aromatic di-dentate ligand (X) 102 does not occupy all coordination sites, leaving up to two unsaturated sites (i.e., uncoordinated sites) for improved adhesion. Different from some existing organometallic precursors that are in ion forms and stabilized by a counter ion, the organometallic precursor molecule 100 is charge-neutral. In some embodiments, the organometallic precursor molecule 100 of the present disclosure may be prepared ex-situ and then deposited on a semiconductor device workpiece using spin-on coating. In some other embodiments, the organometallic precursor molecule 100 may be deposited on a semiconductor device workpiece using chemical vapor deposition (CVD) or atomic layer deposition (ALD).

In the depicted embodiment, the aromatic di-dentate ligand 102 may be 2,2'-bipyrazine that includes two pyrazine rings linked together at position 2 of the first pyrazine ring and position 2' of the second pyrazine ring. The two pyrazine rings may be referred to a first pyrazine ring and a second pyrazine ring. The first pyrazine ring includes nitrogen atoms at positions 1 and 4. The second pyrazine ring includes nitrogen atoms at positions 1' and 4'. The 2,2'-bipyrazine is coordinated to the metal ion 104 by way of the nitrogen atom at position 1 of the first pyrazine ring and at position 1' of the second pyrazine ring. The metal ion 104 is further coordinated to two EUV-cleavable ligands 106. The nitrogen atoms at position 4 of the first pyrazine ring and position 4' of the second pyrazine ring may be activated by EUV radiation. As will be described below, once activated, they may coordinate to a metal ion 104 from which one or more EUV-cleavable ligands 106 have been cleaved. The EUV-cleavable ligand 106 may include an alkenyl group or a carboxylate group. The alkenyl group or the carboxylate group may include hydrogen, fluorine, or an alkyl group. When present, alkyl groups in the EUV-cleavable ligands 106 may be linear, branched or cyclic and may include 1 to 6 carbon atoms. Both the alkenyl group and the carboxylate group include a double bond, which may be severed by incidence of EUV radiation, giving these EUV-cleavable ligands their EUV cleavable property. Due to the π conjugated system in each of the pyrazine rings, the pyrazine rings are planar. In fact, 2,2'-bipyrazine may assume a trans planar configuration. As such, the organometallic precursor molecule 100 may be symmetric with respect to the bond between position 2 of the first pyrazine ring and position 2' of the second pyrazine ring.

Figure 2:
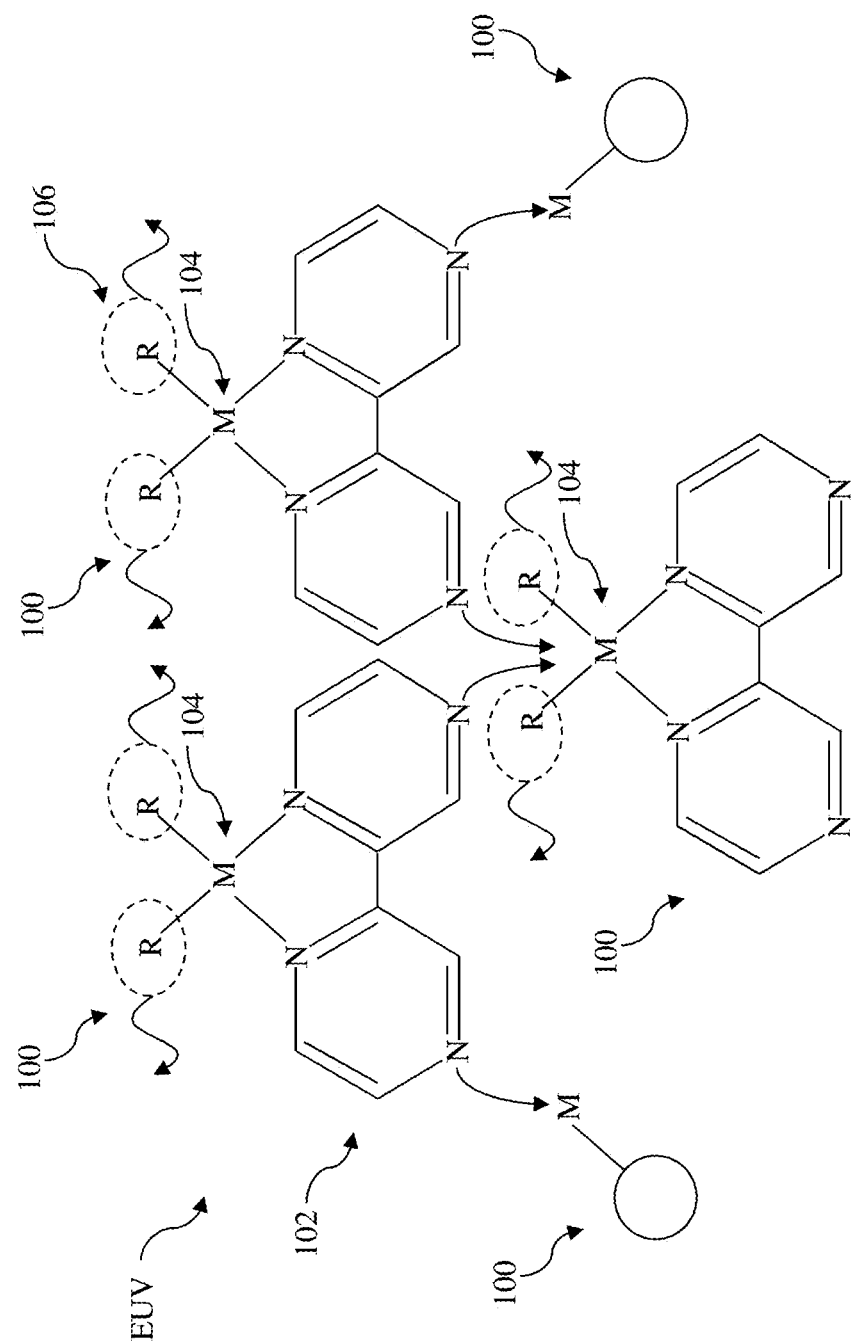
FIGS. 2 and 3 schematically illustrate changes to coordination of organometallic precursor molecules due to incidence of EUV radiation, according to various aspects of the present disclosure.
Figure 3:
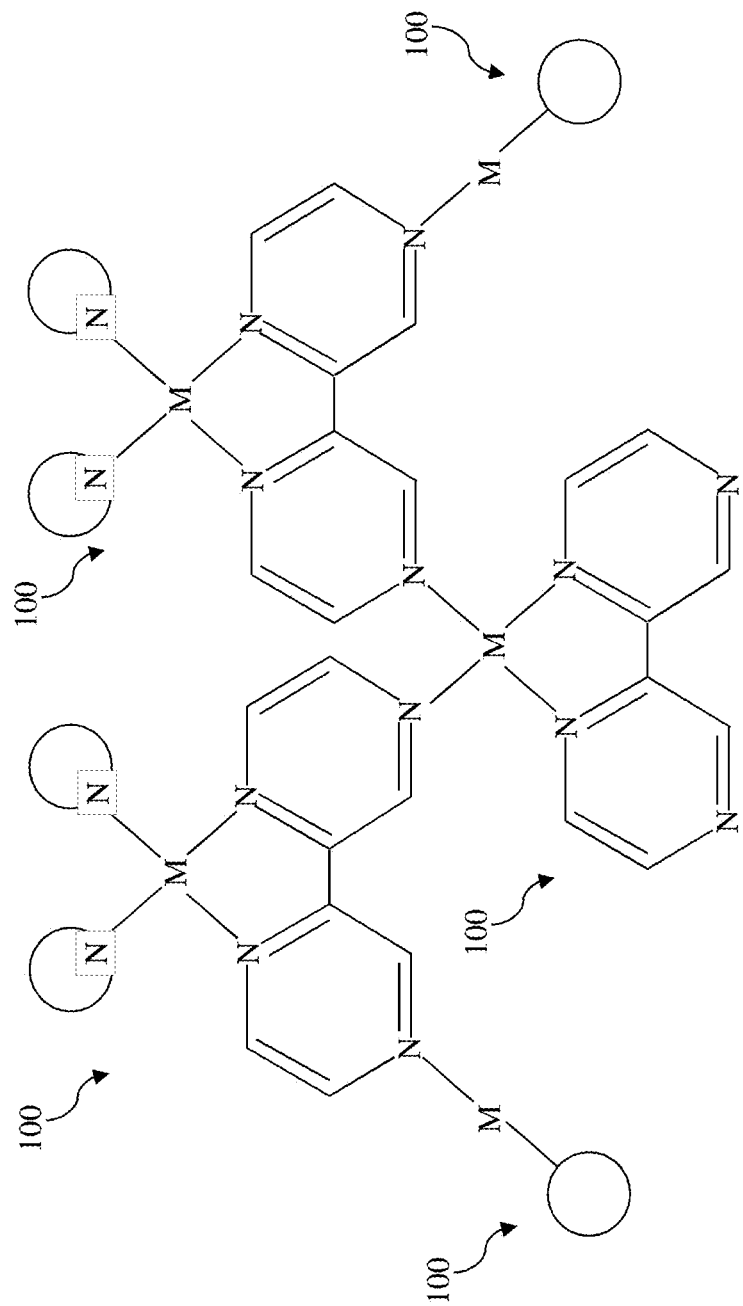

FIGS. 2 and 3 schematically illustrate changes to coordination of organometallic precursor molecules 100 due to incidence of EUV radiation. For illustration purposes, three organometallic precursor molecules 100 are shown in FIGS. 2 and 3. Referring to FIG. 2, the incidence of EUV may generate radicals that may cleave off the EUV-cleavable ligands 106, creating vacant coordination sites on the metal ion 104 and may activate the nitrogen atoms at positions 4 or positions 4'. As shown in FIG. 2, the activated nitrogen atoms may be available to coordinate to vacant coordination sites on metal ions 104 of other organometallic precursor molecules 100 (shown as circles for ease of illustration). Reference is made to FIG. 3. During a post-exposure bake process following the EUV exposure, the activated nitrogen atoms at positions 4 or 4' may coordinate with the available coordination sites on the metal ions 104 of another organometallic precursor molecules 100.

Figure 4:
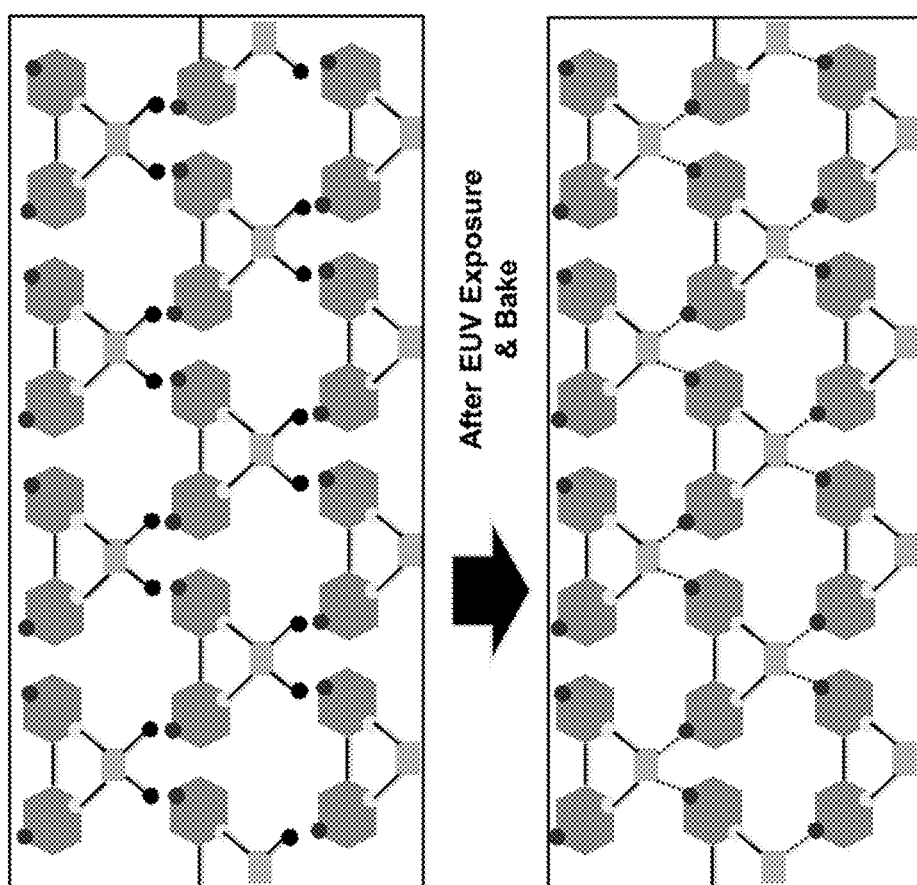
FIG. 4 schematically illustrates ordered cross-linking of organometallic precursor molecules, according to various aspects of the present disclosure.

Due to the trans planar configuration of the organometallic precursor molecules 100, cross-linking among organometallic precursor molecules 100 may take place in a layer on a molecular plane. FIG. 4 illustrates ordered cross-linking of organometallic precursor molecules 100 in such a layer. With respect to each of the organometallic precursor molecules 100, EUV exposure may cleave off the EUV-cleavable ligands 106 from the metal ion 104 and activate the nitrogen atoms at position 4 and position 4'. During the post-exposure bake process, the activated position-4 (or positon-4') nitrogen atoms become coordinated to available sites on the metal ions 104. As shown in FIG. 4, the metal ion 104 of an organometallic precursor molecule 100 may coordinate to two position-4 (or position-4') nitrogen atoms of two other organometallic precursor molecules 100, thereby cross-linking them together. At the same time, the nitrogen-atoms at position 4 and position 4' of the same organometallic precursor molecule 100 are coordinated to two metal ions 104 of two other organometallic precursor molecules. With each metal ion 104 coordinated to four position-4 (or position 4') nitrogen atoms, the cross-linked organometallic precursor molecules 100 may have good short-range and long-range orders in each layer. Among different layers (or molecular planes), π stacking (or pi stacking or π-π stacking) between aromatic pyrazine rings controls the noncovalent interlayer interaction. π stacking facilitates establishment of ordered stacking among different layers (or molecular planes). Because of the symmetric structure of the organometallic precursor molecules 100 as well as the π stacking among aromatic pyrazine rings, organometallic precursor molecules 100 of the present disclosure may result in a crystalline polymeric structure that may provide uniform crosslinking, reduce defects, reduce scum, improve LER, and promote high development contrast.

Figure 5:
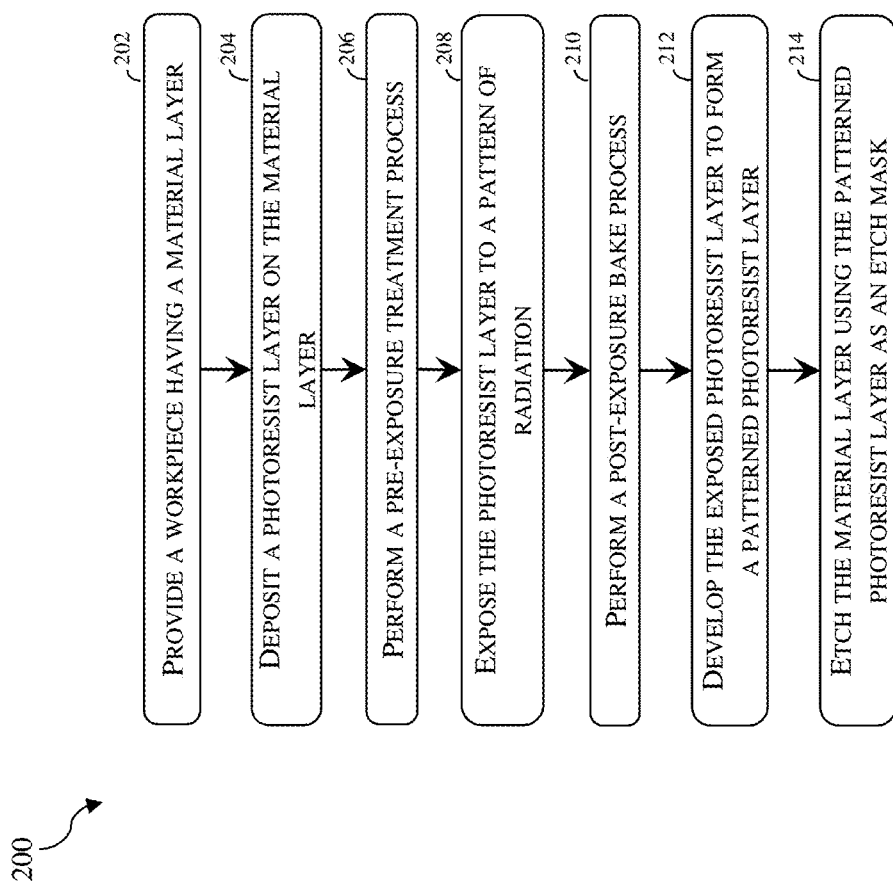
FIG. 5 illustrates a flowchart of a method 200 for patterning a workpiece, according to various aspects of the present disclosure.

Generally speaking, a positive photoresist (or a positive tone photoresist) is a type of photoresist in which the portion of the photoresist that is exposed to light becomes soluble to the photoresist developer. The unexposed portion of the photoresist remains insoluble to the photoresist developer. A negative photoresist (or a negative tone photoresist) is a type of photoresist in which the portion of the photoresist that is exposed to light becomes insoluble to the photoresist developer. The unexposed portion of the photoresist is dissolved by the photoresist developer. Because EUV irradiation forms crosslinks to reduce solubility of the organometallic precursor molecule 100 in a developer, the organometallic precursor molecule 100 of the present disclosure may be an active ingredient in a negative photoresist for EUV lithography. FIG. 5 illustrates a flowchart of a method 200 for patterning a material layer on a workpiece using a negative photoresist that includes the organometallic precursor molecule 100 described herein. Method 200 is merely an example and is not intended to limit the present disclosure to what is explicitly illustrated in method 200. Additional steps may be provided before, during and after the method 200, and some steps described can be replaced, eliminated, or moved around for additional embodiments of the method. Not all steps are described herein in detail for reasons of simplicity. Method 200 is described below in conjunction with FIGS. 6-11, which are fragmentary cross-sectional views of a workpiece 300 at different stages of fabrication according to embodiments of method 200. Additionally, throughout the present application, like reference numerals denote like features, unless otherwise excepted.

Figure 6:
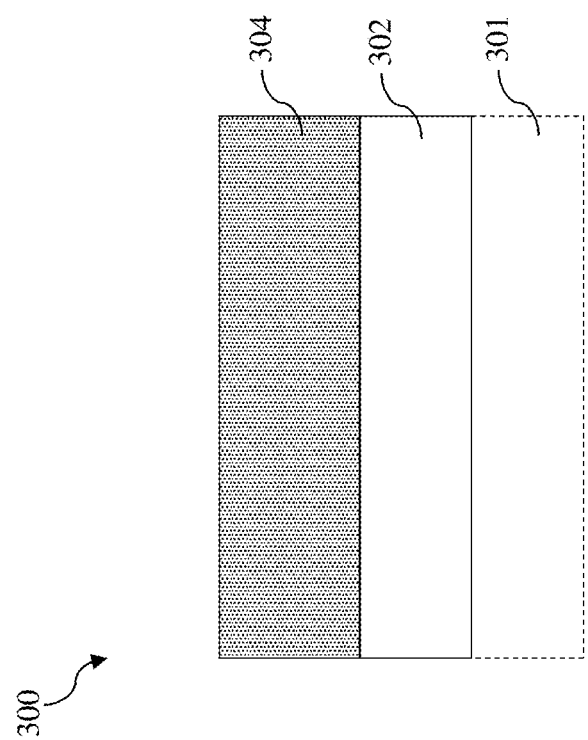

Referring to FIGS. 5 and 6, method 200 includes a block 202 where a workpiece 300 is provided. The workpiece 300 includes a substrate 301 and a material layer 302 disposed over the substrate 301. It is noted that the substrate 301 is illustrated in dotted lines in FIG. 6 and will be omitted from FIGS. 7-11 for simplicity. The substrate 301 may include an elementary (single element) semiconductor, such as silicon (Si) and/or germanium (Ge); a compound semiconductor, such as silicon carbide (SiC), gallium arsenide (GaAs), gallium phosphide (GaP), indium phosphide (InP), indium arsenide (InAs), and/or indium antimonide (InSb); an alloy semiconductor such as silicon germanium (SiGe), gallium arsenic phosphide (GaAsP), aluminum indium arsenide (AlInAs), aluminum gallium arsenide (AlGaAs), gallium indium arsenide (GaInAs), gallium indium phosphide (GaInP), and/or gallium indium arsenic phosphide (GaInAsP); a non-semiconductor material, such as soda-lime glass, fused silica, fused quartz, and/or calcium fluoride ($CaF_2$); and/or combinations thereof. In some other embodiments, the substrate 301 may be a single-layer material having a uniform composition; alternatively, the substrate 301 may include multiple material layers having similar or different compositions suitable for IC device manufacturing. In one example, the substrate 301 may be a silicon-on-insulator (SOI) substrate having a semiconductor silicon layer formed on a silicon oxide layer. The substrate 301 may include various circuit features formed thereon including, for example, field effect transistors (FETs), metal-oxide semiconductor field effect transistors (MOSFETs), CMOS transistors, high voltage transistors, high frequency transistors, bipolar junction transistors, diodes, resistors, capacitors, inductors, varactors, other suitable devices, and/or combinations thereof.

The material layer 302 over the substrate 301 represents a topmost layer on which a photoresist layer 304 (to be described below) will be deposited. In some embodiments, the material layer 302 may be a dielectric layer that serves as a hard mask layer, a bottom antireflective coating (BARC), or an insulation layer. In these embodiments, the material layer 302 may include silicon oxide, silicon nitride, silicon oxynitride, silicon carbonitride, silicon oxycarbonitride, a metal oxide, silicon carbide, or silicon oxycarbide. Example metal oxides may include high-k dielectric materials such as titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), or $(Ba,Sr)TiO_3$ (BST). In some other embodiments, the material layer 302 may include a semiconductor material such as silicon (Si), germanium (Ge), gallium arsenide (GaAs), gallium phosphide (GaP), gallium nitride (GaN), or silicon germanium (SiGe). In still other embodiments, the material layer 302 may include a polymer layer, such as a polyimide layer or a polymeric BARC layer. In yet still other embodiments, the material layer 302 may include a conductive material, such as titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), aluminum (Al), tungsten (W), nickel (Ni), titanium (Ti), ruthenium (Ru), cobalt (Co), platinum (Pt), tantalum carbide (TaC), tantalum silicon nitride (TaSiN), or copper (Cu). When the material layer 302 includes surface functional groups, such as a hydroxyl group or an amine group, the material layer 302 may form good adhesion with the subsequently deposited photoresist layer 304 as the photoresist layer 304 includes the organometallic precursor molecule 100, which includes uncoordinated sites for adhesion. In some embodiments where the material layer 302 may catalyze pre-mature crosslinking of the photoresist layer 304 (to be described below), at block 202, a very thin silicon oxide layer or a very thin polymer layer may be deposited on the material layer 302 before the deposition of the photoresist layer.

Referring to FIGS. 5 and 6, method 200 includes a block 204 where a photoresist layer 304 is deposited on the material layer 302. The photoresist layer 304 includes the organometallic precursor molecule 100 described above and may include other additives or surfactants. The photoresist layer 304 may be a negative photoresist layer. In some embodiments, the photoresist layer 304 may be deposited using spin-on coating, CVD, or atomic layer deposition (ALD). When the photoresist layer 304 is deposited using spin-on coating, the organometallic precursor molecule 100 may be dissolved or dispersed in a dispersion or a solution along with additives and surfactants and then coated on the material layer 302. In some instances, the solution for the coating of the photoresist layer 304 may also include other cross-linkable polymers, such as poly(2-hydroxyethyl methacrylate) (pHEMA), poly(4-hydroxystyrene) (PHS), polyglycidyl ether, or polyether polyol. The inclusion of these other cross-linkable polymers may enhance the cross-linking reaction after EUV exposure. When the photoresist layer 304 is deposited using ALD or CVD, gas precursors for the organometallic precursor molecule 100 may be directed to the material layer 302 where the gas precursors react with one another and with the material layer 302 to form the photoresist layer 304. In some instances, the gas precursors may include a first gas precursor and a second gas precursor. The first gas precursor may include a halogenated EUV-cleavable ligand, such as an alkene halide. The second gas precursor may include the metal ion 104 coordinated with the aromatic di-dentate ligand 102 and halides. The halogen components allow the gas precursors to be in the gaseous form. During the CVD or ALD process, the material layer 302 may be heated and the halogen components may be removed when the first and second gas precursors come in contact with the heated material layer 302, thereby forming the organometallic precursor molecule 100 in the photoresist layer 304.

Figure 7:
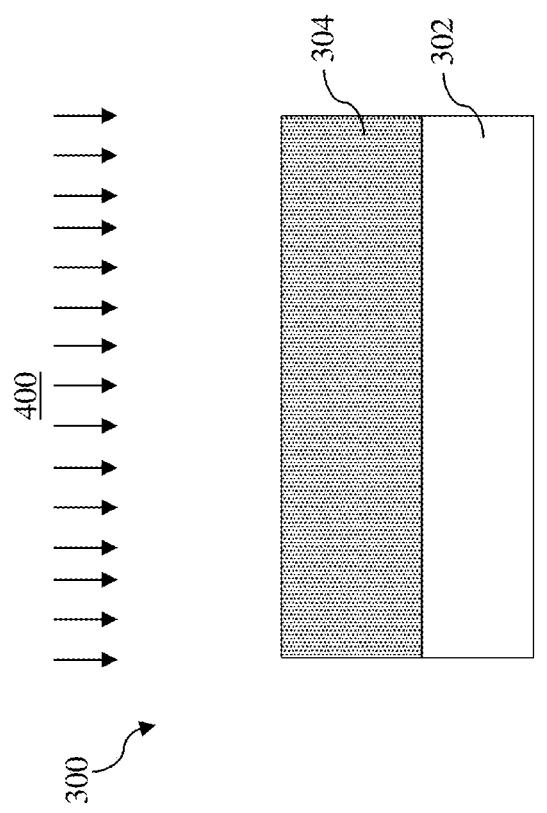

Referring to FIGS. 5 and 7, method 200 includes a block 206 where a pre-exposure treatment process 400 is performed. The pre-exposure treatment process 400 may also be referred to as a post-application treatment process 400. The pre-exposure treatment process 400 facilitates outgassing of undesirable species or removes excess moisture in the photoresist layer 304. The undesirable species may include byproducts or leaving groups during the CVD or ALD process when gaseous precursors are used to deposit the photoresist layer 304. Examples may include halide-containing species. Depending on the property of the species to be removed, the pre-exposure treatment process 400 may include a bake process, an infrared curing process, an ultraviolet (UV) curing process, or a visible light curing process. In some alternative embodiments where undesirable species are to be neutralized, the pre-exposure treatment process may include modifying the surface of the photoresist layer 304 with a reactant gas, such as silane ($SiH_4$). When the pre-exposure treatment process 400 includes a bake process, the baking temperature may be between about 60° C. and about 170° C.

Figure 8:
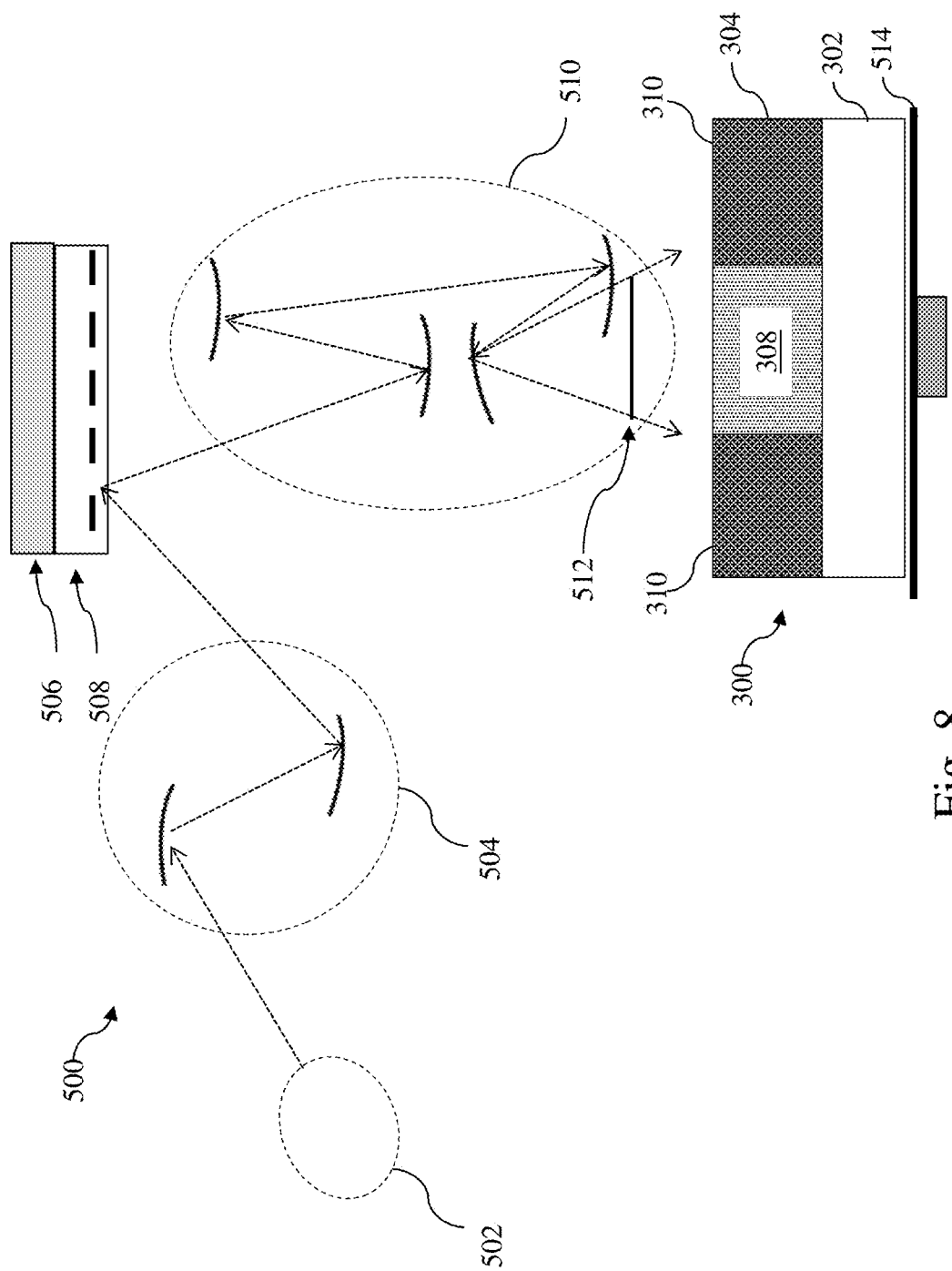

Referring to FIGS. 5 and 8, method 200 includes a block 208 where the photoresist layer 304 is exposed to a pattern of radiation. The exposure at block 208 may be performed using a lithography system 500, which is schematically shown in FIG. 8. The lithography system 500 may also be generically referred to as a scanner that is operable to perform lithographic processes including exposure with a respective radiation source and in a particular exposure mode. In at least some of the present embodiments, the lithography system 500 includes an extreme ultraviolet (EUV) lithography system designed to expose a photoresist layer, such as the photoresist layer 304, by EUV radiation. The lithography system 500 of FIG. 8 includes a plurality of subsystems such as an EUV source 502, an illuminator 504, a mask stage 506 configured to receive a mask 508, projection optics 510, and a substrate stage 514 configured to receive a workpiece, such as the workpiece 300. A general description of the operation of the lithography system 500 may be given as follows: EUV radiation from the EUV source 502 is directed toward the illuminator 504 (which includes a set of reflective mirrors) and projected onto the reflective mask 508. A reflected mask image is directed toward the projection optics 510, which focuses the EUV light and projects the EUV light onto the workpiece 300 to expose an EUV resist layer deposited thereupon. Additionally, in various examples, each subsystem of the lithography system 500 may be housed in, and thus operate within, a high-vacuum environment, for example, to reduce atmospheric absorption of EUV light.

In the embodiments described herein, the EUV source 502 may be used to generate the EUV radiation. In some embodiments, the EUV source 502 includes a plasma source, such as for example, a discharge produced plasma (DPP) or a laser produced plasma (LPP). In some examples, the EUV radiation may include radiation having a wavelength centered at about 13.5 nm. In some embodiments, the EUV source 502 also includes a collector, which may be used to collect EUV radiation generated from the plasma source and to direct the EUV radiation toward imaging optics such as the illuminator 504. As described above, EUV radiation from the EUV source 502 is directed toward the illuminator 504. In some embodiments, the illuminator 504 may include reflective optics, such as a single mirror or a mirror system having multiple mirrors in order to direct radiation from the EUV source 502 onto the mask stage 506, and particularly to the mask 508 secured on the mask stage 506. In some examples, the illuminator 504 may include a zone plate, for example, to improve focus of the EUV radiation. In some embodiments, the illuminator 504 may be configured to shape the EUV radiation passing therethrough in accordance with a particular pupil shape, and including for example, a dipole shape, a quadrupole shape, an annular shape, a single beam shape, a multiple beam shape, and/or a combination thereof. In some embodiments, the illuminator 504 is operable to configure the mirrors (i.e., of the illuminator 504) to provide a desired illumination to the mask 508. In one example, the mirrors of the illuminator 504 are configurable to reflect EUV radiation to different illumination positions. In some embodiments, a stage prior to the illuminator 504 may additionally include other configurable mirrors that may be used to direct the EUV radiation to different illumination positions within the mirrors of the illuminator 504. In some embodiments, the illuminator 504 is configured to provide an on-axis illumination (ONI) to the mask 508. In some embodiments, the illuminator 504 is configured to provide an off-axis illumination (OAI) to the mask 508. It should be noted that the optics employed in the EUV lithography system 500, and in particular optics used for the illuminator 504 and the projection optics 510, may include mirrors having multilayer thin-film coatings known as Bragg reflectors. By way of example, such a multilayer thin-film coating may include alternating layers of Mo and Si, which provides for high reflectivity at EUV wavelengths (e.g., about 13 nm).

As discussed above, the lithography system 500 also includes the mask stage 506 configured to secure the mask 508. Since the lithography system 500 may be housed in, and thus operate within, a high-vacuum environment, the mask stage 506 may include an electrostatic chuck (e-chuck) to secure the mask 508. As with the optics of the EUV lithography system 500, the mask 508 is also reflective. As illustrated in the example of FIG. 8, radiation is reflected from the mask 508 and directed towards the projection optics 510, which collects the EUV radiation reflected from the mask 508. By way of example, the EUV radiation collected by the projection optics 510 (reflected from the mask 508) carries an image of the pattern defined by the mask 508. In various embodiments, the projection optics 510 provides for imaging the pattern of the mask 508 onto the workpiece 300 secured on the substrate stage 514 of the lithography system 500. In particular, in various embodiments, the projection optics 510 focuses the collected EUV light and projects the EUV light onto the workpiece 300 to expose the photoresist layer 304 on the workpiece 300. As described above, the projection optics 510 may include reflective optics, as used in EUV lithography systems such as the lithography system 500. In some embodiments, the illuminator 504 and the projection optics 510 are collectively referred to as an optical module of the lithography system 500.

In some embodiments, the lithography system 500 also includes a pupil phase modulator 512 to modulate an optical phase of the EUV radiation directed from the mask 508, such that the light has a phase distribution along a projection pupil plane. In some embodiments, the pupil phase modulator 512 includes a mechanism to tune the reflective mirrors of the projection optics 510 for phase modulation. For example, in some embodiments, the mirrors of the projection optics 510 are configurable to reflect the EUV light through the pupil phase modulator 512, thereby modulating the phase of the light through the projection optics 510. In some embodiments, the pupil phase modulator 512 utilizes a pupil filter placed on the projection pupil plane. By way of example, the pupil filter may be employed to filter out specific spatial frequency components of the EUV radiation reflected from the mask 508. In some embodiments, the pupil filter may serve as a phase pupil filter that modulates the phase distribution of the light directed through the projection optics 510.

As shown in FIG. 8, using the lithography system 500, an exposed portion 310 of the photoresist layer 304 is exposed to EUV radiation while an unexposed portion 308 remains unexposed. The organometallic precursor molecule 100 in the exposed portion 310 of the photoresist layer 304 becomes crosslinked. More particularly, with reference to FIGS. 1 and 2, EUV radiation from the lithography system 500 generates radicals. The radicals cleave off the EUV-cleavable ligands 106 from the metal ion 104. The nitrogen atoms at position 4 or position 4' becomes activated and coordinates with another metal ion having an uncoordinated site. The aromatic di-dentate ligand 102 serve as bridge ligands to form crosslinks. The same crosslinking does not take place in the unexposed portion 308 due to lack to radicals. As described above with respect to FIG. 4, due to the trans planar configuration of the organometallic precursor molecules 100, cross-linking among organometallic precursor molecules 100 may take place in a layer on a molecular plane. With respect to each of the organometallic precursor molecules 100 in the photoresist layer 304, EUV exposure may cleave off the EUV-cleavable ligands 106 from the metal ion 104 and activate the nitrogen atoms at position 4 and position 4' of the aromatic di-dentate ligand 102.

Figure 9:
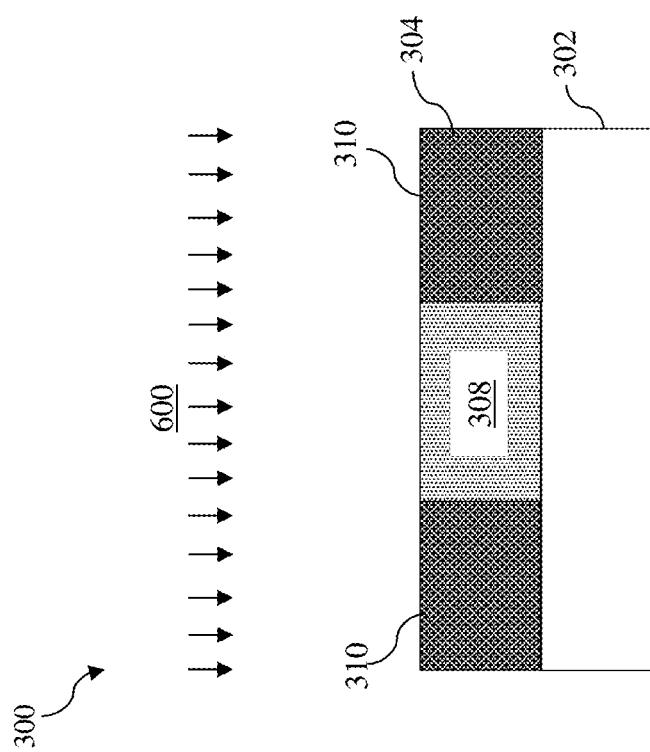

Referring to FIGS. 5 and 9, method 200 includes a block 210 where a post-exposure bake process 600 is performed. In some implementations, a baking temperature or a baking temperature profile of the post-exposure bake process 600 is selected to facilitate crosslinking and ensure removal of the leaving group generated during the EUV exposure process at block 208. The baking temperature of the post-exposure bake process 600 may be between about 150° C. and about 300° C. During the post-exposure bake process 600, the activated position-4 (or positon-4') nitrogen atoms of an organometallic precursor molecule 100 in the exposed portion 310 become coordinated to available sites on the metal ions 104 of two adjacent organometallic precursor molecules 100. The metal ion 104 of the same organometallic precursor molecule 100 may coordinate to two position-4 (or position-4') nitrogen atoms of two other organometallic precursor molecules 100, thereby cross-linking them together. With each metal ion 104 coordinated to four position-4 (or position 4') nitrogen atoms, the cross-linked organometallic precursor molecules 100 may have good short-range and long-range orders in each layer. Among different layers (or molecular planes), π stacking (or pi stacking or π-π stacking) between aromatic pyrazine rings controls the noncovalent interlayer interaction. π stacking facilitates establishment of ordered stacking among different layers (or molecular planes). Because of the symmetric structure of the organometallic precursor molecules 100 as well as the π stacking among aromatic pyrazine rings, organometallic precursor molecules 100 of the present disclosure may result in a crystalline polymeric structure that may provide uniform crosslinking, reduce defects, reduce scum, improve LER, and promote high development contrast. The leaving groups that are removed at block 210 may include the EUV-cleavable ligands 106, halide-containing species, or combinations thereof.

Referring to FIGS. 5 and 10, method 200 includes a block 212 where the exposed photoresist layer 304 is developed to form a patterned photoresist layer 312. At block 212, a developer solution is used to remove the unexposed portion 308, which was not crosslinked at block 208. The developer solution is selected such that it is suitable to selectively dissolve and remove the unexposed portion 308 (not cross-linked) while the exposed portion 310 (crosslinked) of the photoresist layer 304 remains substantially intact. Suitable developer solution may include solvents such as n-butyl acetate, ethanol, hexane, benzene, toluene, water, isopropyl alcohol (IPA), or 2-heptanone. In some embodiments, block 212 may also include one or more descum or rinsing processes to remove any residual photoresist layer 304 or debris. At the conclusion of operations at block 212, the patterned photoresist layer 312 is formed. Due to the removal of the unexposed portion 308, the patterned photoresist layer 312 includes an opening 314 and the material layer 302 is exposed in the opening 314.

Referring to FIGS. 5 and 11, method 200 includes a block 214 where the material layer 302 is etched using the patterned photoresist layer 312 as an etch mask. In some embodiments, the material layer 302 is etched with a dry etch process 700, such as a reactive ion etch (RIE) process, using the patterned photoresist layer 312 as the etch mask. In some examples, the dry etch process 700 may be implemented using an etchant gas that includes a fluorine-containing etchant gas (e.g., $NF_3$, $CF_4$, $SF_6$, $CH_2F_2$, $CHF_3$, and/or $C_2F_6$), an oxygen-containing gas (e.g., $O_2$ or $O_3$), a chlorine-containing gas (e.g., $Cl_2$, $CHCl_3$, $CCl_4$, $SiCl_4$, and/or $BCl_3$), a nitrogen-containing gas (e.g., $N_2$ or $NH_2$), a bromine-containing gas (e.g., HBr and/or $CHBr_3$), an iodine-containing gas, argon (Ar), other suitable gases and/or plasmas, or combinations thereof. In some embodiments represented in FIG. 11, the dry etch process 700 forms a recess 316 in the material layer 302. While the recess 316 is shown as not extending through the material layer 302, it may extend through the material layer 302 in alternative embodiments. Operations at block 214 may be applied to form fins of a fin-type field effect transistor (FinFET), a fin-shaped structure for formation of a multi-bridge-channel (MBC) transistor, a dummy gate stack formed during fabrication of a FinFET or an MBC transistor, a source/drain contact opening, a gate contact opening, a via opening, or a metal line trench. After the recess 316 is formed, the patterned photoresist layer 312 may be removed by ashing or selective etching.

Although not intended to be limiting, one or more embodiments of the present disclosure provide benefits to a semiconductor device and a formation process thereof. For example, the present disclosure provides an organometallic precursor in a negative tone photoresist. The organometallic precursor includes an aromatic di-dentate ligand with a structural match for intermolecular coordination. An example of the organometallic precursor includes a 2,2'-bipyrazine molecule coordinated to a transition metal that has high EUV absorption. The transition metal is also coordinated to EUV-cleavable ligands that may be cleaved off by EUV radiation to form non-coordinated sites. When the aromatic di-dentate ligand is an aromatic 2,2'-bipyrazine, two nitrogen atoms in the opposite side may coordinate to the non-coordinated sites. The structural match of the intermolecular coordination and the π-π interactions of the aromatic ligand may result in an ordered packing of layers. The ordered packing gives rise to a crystalline polymeric structure, leading to defect reduction (scum reduction), good LER, and high contrast.

In one exemplary aspect, the present disclosure is directed to an organometallic precursor is provided. The organometallic precursor includes an aromatic di-dentate ligand, a transition metal coordinated to the aromatic di-dentate ligand, and an extreme ultraviolet (EUV) cleavable ligand coordinated to the transition metal. The aromatic di-dentate ligand includes a plurality of pyrazine molecules.

In some embodiments, the aromatic di-dentate ligand includes 2,2'-bipyrazine. In some implementations, the transition metal has a high atomic absorption cross section. In some instances, the transition metal is selected from a group consisting of tin (Sn), bismuth (Bi), antimony (Sb), indium (In), and tellurium (Te). In some embodiments, the organometallic precursor may further include poly(2-hydroxyethyl methacrylate) (pHEMA), poly(4-hydroxystyrene) (PHS), polyglycidyl ether, or polyether polyol. In some embodiments, the EUV cleavable ligand includes an alkenyl group or a carboxylate group. In some instances, the EUV cleavable ligand includes a fluoro-substitute.

In another exemplary aspect, the present disclosure is directed to an extreme ultraviolet (EUV) photoresist precursor. The extreme ultraviolet (EUV) photoresist precursor includes an aromatic di-dentate ligand including a first pyrazine ring and a second pyrazine ring, a transition metal coordinated to a nitrogen atom on the first pyrazine ring and a nitrogen atom on the second pyrazine ring, a first EUV cleavable ligand coordinated to the transition metal, and a second EUV cleavable ligand coordinated to the transition metal.

In some embodiments, the aromatic di-dentate ligand includes bipyrazine and the first pyrazine ring is connected to the second pyrazine ring. In some implementations, the aromatic di-dentate ligand includes 2,2'-bipyrazine. In some instances, the transition metal has a high atomic absorption cross section. In some embodiments, the transition metal is selected from a group consisting of tin (Sn) ion, bismuth (Bi) ion, antimony (Sb) ion, indium (In) ion, and tellurium (Te) ion. In some embodiments, the EUV photoresist precursor may further include poly(2-hydroxyethyl methacrylate) (pHEMA), poly(4-hydroxystyrene) (PHS), polyglycidyl ether, or polyether polyol. In some embodiments, the EUV cleavable ligand includes an alkenyl group or a carboxylate group. In some instances, the EUV cleavable ligand includes a fluoro-substitute.

In still another exemplary aspect, the present disclosure is directed to a method. The method includes depositing a photoresist layer directly on a material layer, wherein the photoresist layer includes a precursor that includes an aromatic di-dentate ligand including a first pyrazine ring and a second pyrazine ring, the first pyrazine ring including a first nitrogen atom and a second nitrogen atom, the second pyrazine ring including a first nitrogen atom and a second nitrogen atom, a transition metal coordinated to the first nitrogen atom on the first pyrazine ring and the first nitrogen atom on the second pyrazine ring, and a first EUV cleavable ligand and a second EUV cleavable ligand coordinated to the transition metal. The method may further include exposing a portion of the photoresist layer to EUV radiation to cleave off the first EUV cleavable ligand and the second EUV cleavable ligand from the transition metal and activate the second nitrogen atom on the first pyrazine ring and the second nitrogen atom on the second pyrazine ring.

In some embodiments, the aromatic di-dentate ligand includes 2,2'-bipyrazine. In some implementations, the depositing of the photoresist layer includes supplying a first gaseous precursor to the material layer. The first gaseous precursor includes the aromatic di-dentate ligand, the transition metal coordinated to the first nitrogen atom on the first pyrazine ring and the first nitrogen atom on the second pyrazine ring, and a first halide group and a second halide group coordinated to the transition metal. The method further includes supplying a second gaseous precursor to the material layer. The second gaseous precursor includes the first EUV cleavable ligand and the second EUV cleavable ligand.

In some embodiments, the depositing of the photoresist layer includes depositing the photoresist layer using spin-on coating. In some instances, the method may further include after the exposing, baking the photoresist layer to crosslink the portion of the photoresist layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An extreme ultraviolet (EUV) photoresist precursor, comprising:
   an aromatic di-dentate ligand comprising a first pyrazine ring and a second pyrazine ring;
   a transition metal coordinated to a nitrogen atom on the first pyrazine ring and a nitrogen atom on the second pyrazine ring;
   a first EUV cleavable ligand coordinated to the transition metal; and
   a second EUV cleavable ligand coordinated to the transition metal.

2. The EUV photoresist precursor of claim 1,
   wherein the aromatic di-dentate ligand comprises bipyrazine,
   wherein the first pyrazine ring is connected to the second pyrazine ring.

3. The EUV photoresist precursor of claim 1, wherein the aromatic di-dentate ligand comprises 2,2'-bipyrazine.

4. The EUV photoresist precursor of claim 1, wherein the transition metal has a high atomic absorption cross section.

5. The EUV photoresist precursor of claim 1, wherein the transition metal is selected from a group consisting of tin (Sn) ion, bismuth (Bi) ion, antimony (Sb) ion, indium (In) ion, and tellurium (Te) ion.

6. The EUV photoresist precursor of claim 1, further comprising:
   poly(2-hydroxyethyl methacrylate) (pHEMA), poly(4-hydroxystyrene) (PHS), polyglycidyl ether, or polyether polyol.

7. The EUV photoresist precursor of claim 1, wherein the EUV cleavable ligand comprises an alkenyl group or a carboxylate group.

8. The EUV photoresist precursor of claim 7, wherein the EUV cleavable ligand comprises a fluoro-substitute.

9. A photoresist precursor, comprising:
   an aromatic di-dentate ligand;
   a transition metal coordinated to the aromatic di-dentate ligand; and
   an extreme ultraviolet (EUV) cleavable ligand coordinated to the transition metal,
   wherein the aromatic di-dentate ligand comprises a first pyrazine molecule and a second pyrazine molecule.

10. The photoresist precursor of claim 9, wherein the aromatic di-dentate ligand comprises 2,2'-bipyrazine.

11. The photoresist precursor of claim 9, wherein the transition metal has a high atomic absorption cross section.

12. The photoresist precursor of claim 9,
   wherein the first pyrazine molecule comprises a first nitrogen atom,
   wherein the second pyrazine molecule comprises a second nitrogen atom,
   wherein the transition metal is coordinated to the first nitrogen atom and the second nitrogen atom.

13. The photoresist precursor of claim 9, wherein the transition metal is selected from a group consisting of tin (Sn), bismuth (Bi), antimony (Sb), indium (In), and tellurium (Te).

14. The photoresist precursor of claim 9, further comprising:
   poly(2-hydroxyethyl methacrylate) (pHEMA), poly(4-hydroxystyrene) (PHS), polyglycidyl ether, or polyether polyol.

15. The photoresist precursor of claim 9, wherein the EUV cleavable ligand comprises an alkenyl group or a carboxylate group.

16. The photoresist precursor of claim 9, wherein the EUV cleavable ligand comprises a fluoro-substitute.

17. A photoresist precursor, comprising:
   a 2,2'-bipyrazine molecule;
   a transition metal coordinated to the 2,2'-bipyrazine molecule; and
   an extreme ultraviolet (EUV) cleavable ligand coordinated to the transition metal,
   wherein the transition metal is selected from a group consisting of tin (Sn) ion, bismuth (Bi) ion, antimony (Sb) ion, indium (In) ion, and tellurium (Te) ion.

18. The photoresist precursor of claim 17, wherein the EUV cleavable ligand comprises an alkenyl group or a carboxylate group.

19. The photoresist precursor of claim 17, wherein the transition metal is coordinated to two nitrogen atoms of the 2,2'-bipyrazine molecule.

20. The photoresist precursor of claim 17 is charge neutral.

* * * * *